United States Patent [19]

Odell et al.

[11] 4,063,119
[45] Dec. 13, 1977

[54] SCHMITT TRIGGER CIRCUIT

[75] Inventors: Alexander D. Odell, Great Dunmow; John M. Young; Kenneth A. M. Arton, both of Harlow, all of England

[73] Assignee: International Standard Electric Corporation, New York, N.Y.

[21] Appl. No.: 725,209

[22] Filed: Sept. 22, 1976

[30] Foreign Application Priority Data

Sept. 25, 1975 United Kingdom ............... 39281/75

[51] Int. Cl.² ..................... H03K 3/286; H03K 3/295; H03K 3/353
[52] U.S. Cl. ..................................... 307/279; 307/290
[58] Field of Search ............... 307/251, 238, 279, 290

[56] References Cited

U.S. PATENT DOCUMENTS

| | | | |
|---|---|---|---|
| 3,612,908 | 10/1971 | Heimbigner | 307/279 |
| 3,851,189 | 11/1974 | Moyer | 307/279 |
| 3,873,856 | 3/1975 | Gerlach et al. | 307/279 |
| 3,882,331 | 5/1975 | Sasaki | 307/279 |
| 3,904,888 | 9/1975 | Griffin | 307/279 X |
| 3,984,703 | 10/1976 | Jorgensen | 307/279 |

Primary Examiner—John S. Heyman
Assistant Examiner—Larry N. Anagnos
Attorney, Agent, or Firm—John T. O'Halloran; Peter C. Van Der Sluys; Vincent B. Ingrassia

[57] ABSTRACT

This invention relates to a Schmitt trigger circuit, and particularly to a Schmitt trigger circuit comprising MOS transistors.

The all MOS transistor Schmitt trigger circuit has a first MOS input inverting amplifier regeneratively coupled with a further MOS transistor to provide the requisite positive feedback voltage, and a second MOS input inverting amplifier, not in the feedback loop but having the feedback voltage also applied thereto, the output being taken from the second inverter.

Separation of output from the feedback loop gives flexible control of input triggering points and output characteristics.

This circuit is intended for use in a MOS IC telephone switching cross-point switch.

2 Claims, 3 Drawing Figures

SCHMITT TRIGGER CIRCUIT

This invention relates to a Schmitt trigger circuit, and particularly to a Schmitt trigger circuit comprising MOS transistors.

MOS realisation can pose problems in the design of an appropriate circuit required to achieve simultaneously satisfactory "on" and "off" triggering points and the requisite output characteristics, as the regenerative action involved in MOS Schmitt trigger circuits results in hysteresis in the voltage transfer characteristic of the circuit. The "on" and "off" triggering points in the transfer characteristic are determined by the relative gains and impedances of the MOS transistors, and in practice a design which has satisfactory input triggering points may well have unsatisfactory output characteristics.

An object of the present invention is to obtain, in a MOS Schmitt trigger circuit, flexible control of "on" and "off" levels and hysteresis with a "low" output voltage condition which is very close to ground potential.

Such a circuit is particularly valuable when driving MOS devices which have low gate threshold voltages, typically when the circuit is used to buffer logic inputs to MOS logic from TTL.

According to the invention there is provided a Schmitt trigger circuit comprising two input signal responsive MOS transistor inverters, the output of one of said inverters being regeneratively coupled with a further MOS transistor and providing a feedback voltage applied to both said inverters, and the output of the other of said inverters being the circuit output.

According to the invention there is also provided a Schmitt trigger circuit comprising a power supply terminal, a reference terminal, a signal input terminal, a signal output terminal, a first MOS transistor, a second MOS transistor and a third MOS transistor having their source-drain paths series connected between said power supply terminal and said reference terminal, the gates of said first and third MOS transistors being connected to said power supply terminal, a fourth MOS transistor having its source-drain path connected between said power supply terminal and the common point between said second MOS transistor and said third MOS transistor, the gate of said fourth MOS transistor being connected to the common point between said first MOS transistor and said second MOS transistor, a fifth MOS transistor and a sixth MOS transisor having their source-drain paths series connected between said power supply terminal and the common point between said second MOS transistor and said third MOS transistor, the gate of said fifth MOS transistor being connected to said power supply terminal, the gate of said sixth MOS transistor being connected to said signal input terminal, and said signal output terminal being connected to the common point between said fifth MOS transistor and said sixth MOS transistor.

An embodiment of the invention will now be described with reference to the accompanying drawings in which.

Figure 1:
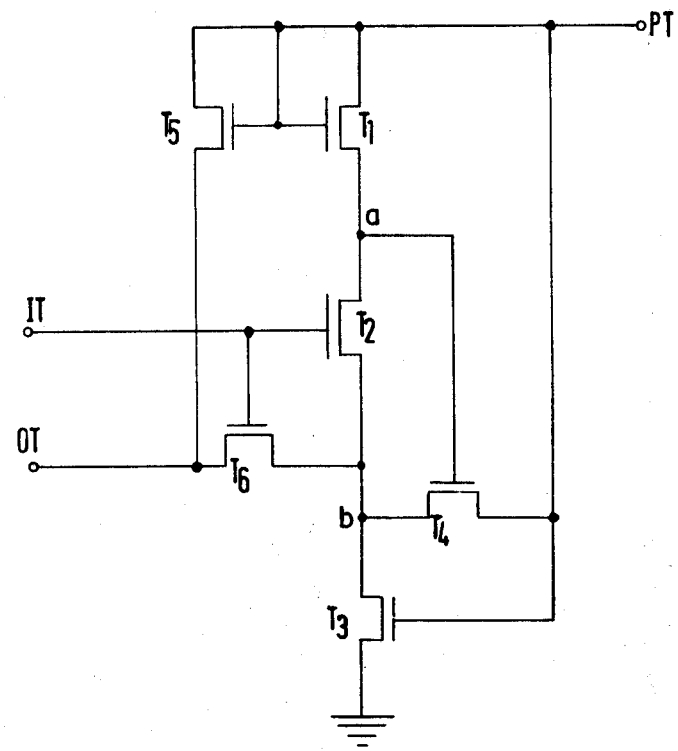
FIG. 1 is a circuit diagram of a MOS transistor Schmitt trigger circuit.

The Schmitt trigger circuit shown in FIG. 1 comprises six N-channel MOS transistors T1 to T6 interconnected as shown between power supply terminal PT, ground, input terminal IT and output terminal OT.

T1 and T2 form an inverting amplifier with feedback introduced into the source electrode of T2 by the voltage developed across T3. The magnitude of this voltage depends on the current flowing in the "source follower" T4 and thus current is determined by the degree of conduction in T2. The feedback is positive, and results in hysteresis in the voltage transfer characteristic of the circuit. The "one" and "off" triggering points in the transfer characteristic are determined by the relative gains and impedances of the four transistors T1 to T4, and if the output was taken from between T1 and T2, at point a, in a conventional arrangement, there could be unsatisfactory output characteristics due to the output being included in the feedback loop a, T4, point b, T2.

This problem is solved by separating the output point from the feeback loop, by the use of an additional inverting amplifier comprising T5 and T6. The feedback voltage developed across T3 is now also applied to this additional amplifying stage. The gains and impedances of T5 and T6 can be adjusted to suit the output voltage requirements, while having a greatly reduced influence on the operation of the positive feedback and hence on the input triggering levels.

To describe the operation of the circuit, assume T2 is "on". With falling input voltage on the gate of T2, T2 turns "off", the voltage at a rises towards supply voltage, with the gate voltage of T4 rising to turn "on", whereupon the voltage at b falls towards ground. The input signal also being applied to the gate of T6 causes T6 to be turned "off" so that the output voltage rises towards supply voltage.

Conversely, with T2 "off" and with a rising input voltage, T2 turns "on", voltage at a gate of T4 falls to turn T4 "off", voltage at b rises. T6 turns "on", output falls.

The circuit shown in FIG. 1 may be used to buffer output from TTL logic 0.8 to 2.4v to MOS logic with gate threshold voltage $V_t$ of 0.7v ± 0.2v, power supply +5v, with the transistors having W/L ratios of T1 — 0.1; T2 — 1.0; T3 — 2.0; T4 — 10.0; T5 — 0.2; T6 — 10.0.

The facility for large scale integration of MOS devices on a single chip, with the inclusion of a number of the above described MOS Schmitt trigger circuits using N-channel devices, finds typical application in a MOS integrated telephone switching crosspoint chip, as a replacement for electro-mechanical contacts. The circuit embodies two 4 × 4 matrices of "contacts" together with associated control electronics, with each chip packaged in a 24 lead DIP and forming a basic module for balanced speech path switching, larger matrices being obtained by combining modules.

Figure 2:
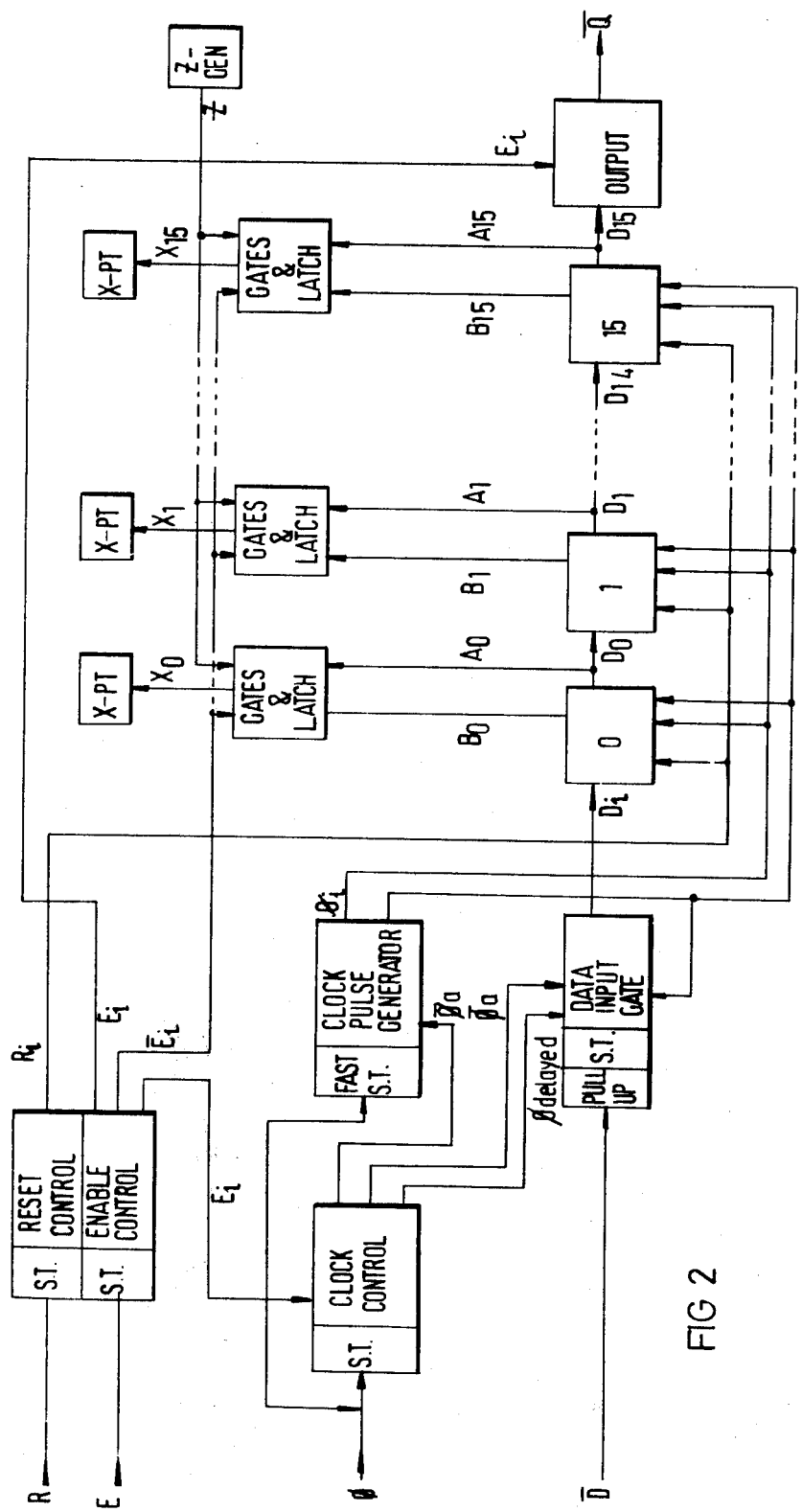
FIGS. 2 and 3 are a block circuit diagram and an integrated circuit chip component layout respectively of a MOS crosspoint circuit.
Figure 3:
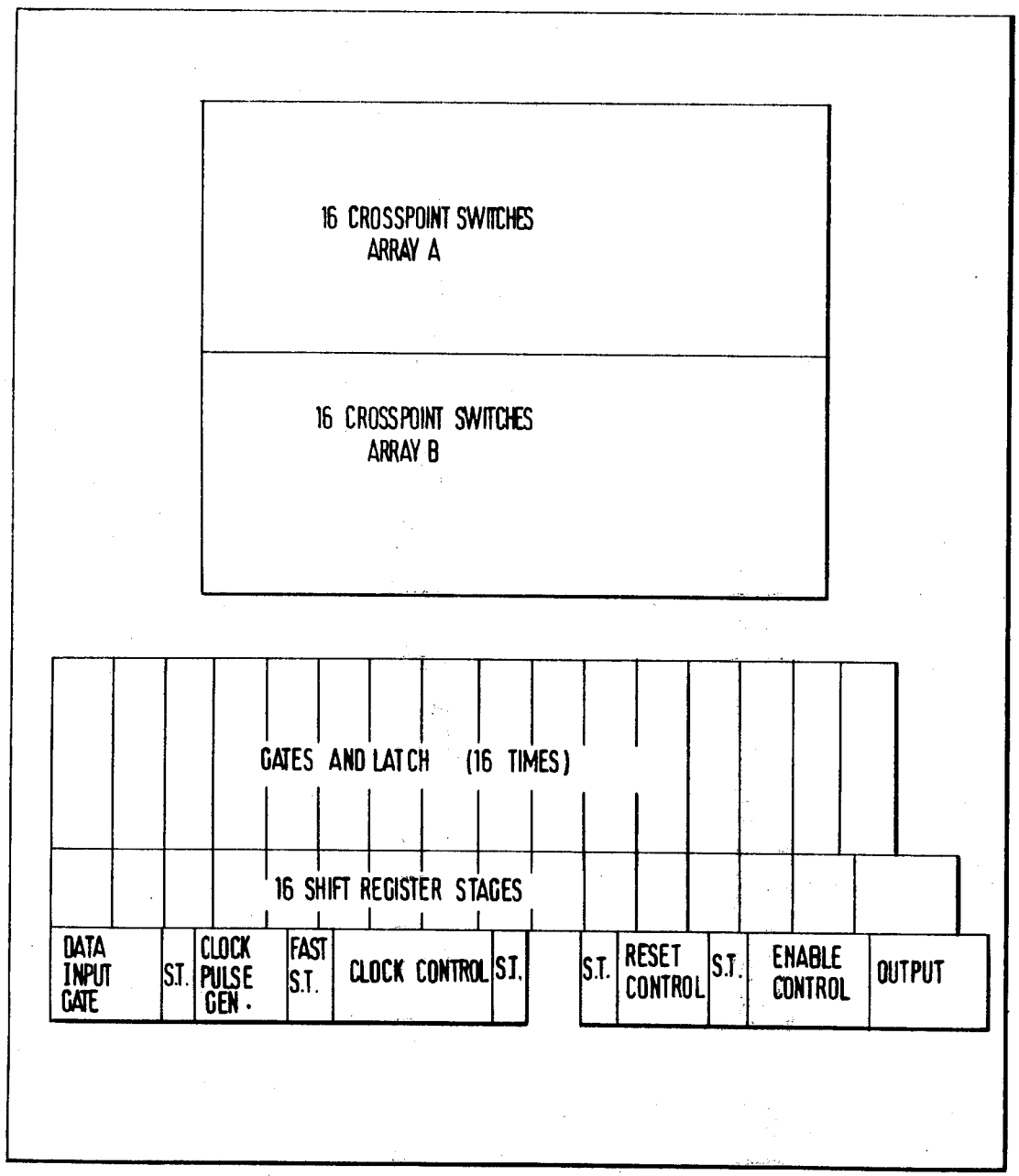

FIG. 2 shows a block diagram of the circuit, and FIG. 3 shows the chip layout of those components contained on the chip. Chip contacts and inter-component tracks are not shown.

There are two 4 × 4 arrays MOS transistors which act as crosspoint switches, the gates of these transistors being controlled by the data pattern in a 16 bit static shift register. The gates of corresponding transistors on the two arrays are connected in parallel. The entry of data into the shift register and the connection of crosspoint gates to the shift register are controlled by Enable and Reset inputs.

There are Schmitt trigger circuits ST associated with the enable and reset controls, clock control, clock pulse generator, and data input.

When Enable is LOW, the internal clock pulses $\phi_i$ and $\Phi_i$ are generated, data can be entered into and read out of the shift register, crosspoints are disabled from the shift register stages and are left in the state existing when Enable went LOW.

When Enable is HIGH, $\phi_i$ pulses are not generated $\Phi_i$ pulses continue to be generated but have no effect on the operation). Therefore the shift register remains with the static data pattern present when Enable went HIGH. The shift register output transistor is held off, i.e. the output $\Phi$ goes high (external pull up). Crosspoint gates are connected to the shift register stages; if a stage output $A_n$ is high the corresponding pair of crosspoint switches are on.

When Reset is LOW, reset has no effect on circuit operation.

When Reset is HIGH, the Enable input is made to appear high, i.e. $\phi_i$ pulses are not generated and output $\Phi$ goes high. All shift register stages are reset to the condition $A_n$ low, $B_n$ high, and since the crosspoints are connected to the shift register all crosspoints are off.

When Reset returns to LOW the reset action is not cancelled until Enable subsequently goes HIGH.

Data is inverted at input and output, i.e. a sequence of 1s at the input will fill the shift register with Os and produce a sequence of 1s at the output.

It is to be understood that the foregoing description of specific examples of this invention is made by way of example only and is not to be considered as a limitation on its scope.

We claim:

1. A Schmitt trigger circuit comprising a power supply terminal, a reference terminal, a signal input terminal, a signal output terminal, a first MOS transistor, a second MOS transistor; and a third MOS transistor having their source-drain paths series connected between said power supply terminal and said reference terminal, the gates of said first and third MOS transistors being connected to said power supply terminal and the gate of said second MOS transistor being connected to said input terminal; a fourth MOS transistor having its source-drain path connected between said power supply terminal, and the common point between said second MOS transistor and said third MOS transistor, the gate of said fourth MOS transistor being connected to the common point between said first MOS transistor and said second MOS transistor, a fifth MOS transistor and a sixth MOS transistor having their source-drain paths series connected between said power supply terminal and the common point between said second MOS transistor and said third MOS transistor, the gate of said fifth MOS transistor being connected to said power supply terminal, the gate of said sixth MOS transistor being connected to said signal input terminal, and said signal output terminal being connected to the common point between said fifth MOS transistor and said sixth MOS transistor.

2. A circuit as claimed in claim 1 in which said MOS transistors are N channel.

* * * * *